United States Patent [19]

Seidler

[11] 4,433,892
[45] Feb. 28, 1984

[54] TERMINAL STRIP WITH AUXILIARY SUPPORT

[75] Inventor: Jack Seidler, Flushing, N.Y.

[73] Assignee: North American Specialties Corp., Flushing, N.Y.

[21] Appl. No.: 336,970

[22] Filed: Jan. 4, 1982

[51] Int. Cl.³ .............................................. H01R 9/09
[52] U.S. Cl. .............................. 339/258 P; 339/275 T; 339/276 SF
[58] Field of Search ............ 339/17 C, 17 CM, 17 M, 339/258 R, 258 P, 275 B, 275 T, 276 SF

[56] References Cited

U.S. PATENT DOCUMENTS

| | | | |
|---|---|---|---|
| 3,713,079 | 1/1973 | Dechelette | 339/258 R |
| 3,764,955 | 10/1973 | Ward | 339/176 MP |
| 4,203,648 | 5/1980 | Seidler | 339/275 T |
| 4,327,958 | 5/1982 | Hughes et al. | 339/276 SK |

FOREIGN PATENT DOCUMENTS 2321828 11/1973 Fed. Rep. of Germany ... 339/275 B

OTHER PUBLICATIONS

13th Annual Connector Symposium, Oct. 8-9, 1980, "A Mass-Termination, Filtered Connector for RS-232-C Circuits", by: Brian F. Whittaker.

Primary Examiner—John McQuade
Assistant Examiner—Gary F. Paumen
Attorney, Agent, or Firm—DeLio and Libert

[57] ABSTRACT

A strip of interconnected edge clips for attachment to contact pads on a circuit-bearing board, in which a plurality of edge clips each have a free end and a stem end with the stem ends of the clips connected with a carrier rail or strip. A pair of spaced-apart spring fingers are on the free ends of the clips for receiving an edge of a circuit-carrying board therebetween, and an elongate auxiliary support strand extends past the free ends of the plurality of clips and is mechanically connected with the free ends of the clips to provide support to the clips. According to another aspect of the invention, the clip has an angularly extending interconnecting portion between the stem end and free end, offsetting the free end in both a sideward and rearward direction relative to the stem end.

2 Claims, 7 Drawing Figures

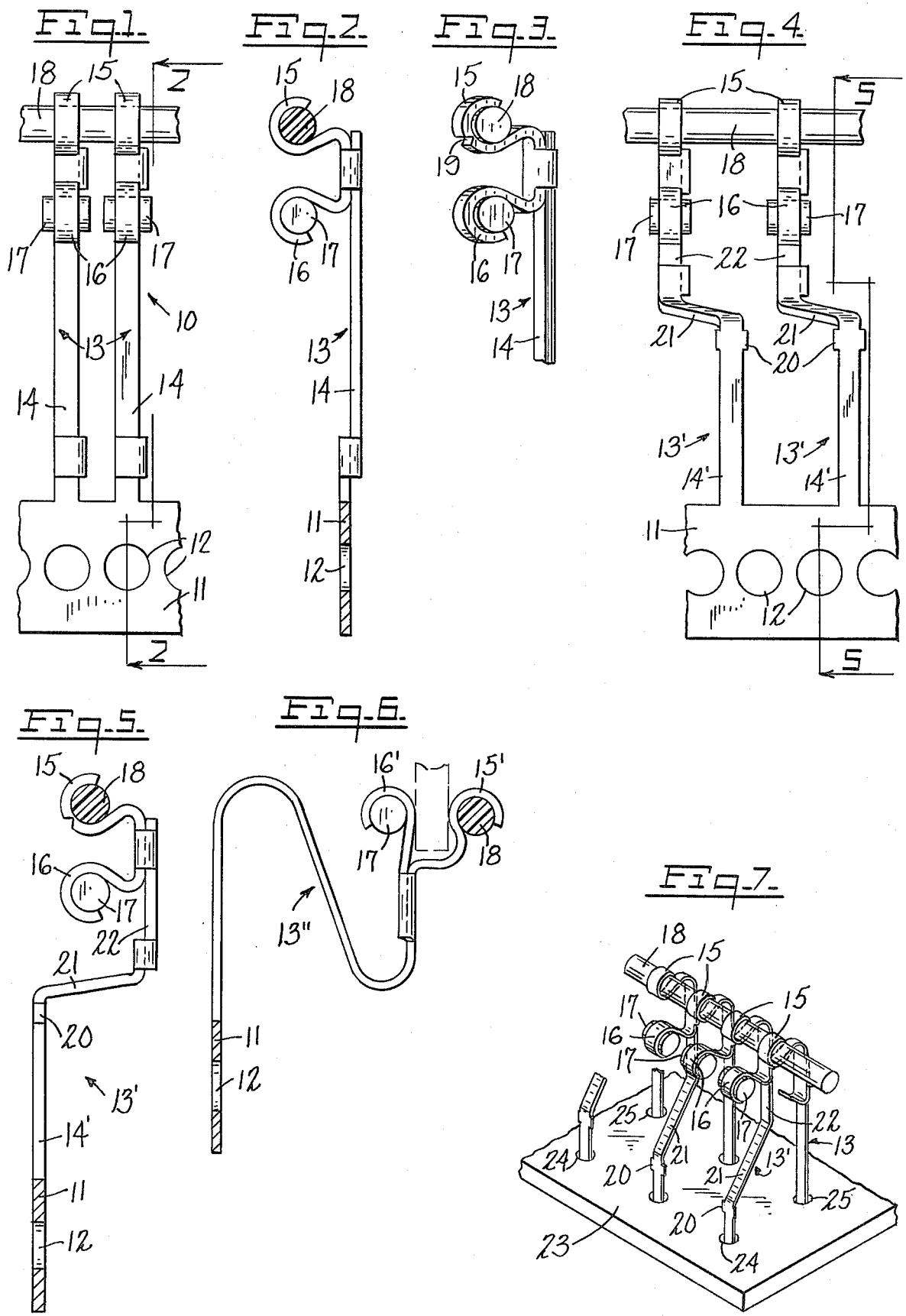

TERMINAL STRIP WITH AUXILIARY SUPPORT

BACKGROUND OF THE INVENTION

1. Field of the Invention

This invention relates generally to terminal clips or edge clips for attachment to a contact pad on a circuit-bearing chip or board. The clip is preferably of the type wherein solder is mechanically connected with the clip in a position to be melted for bonding the clip to the contact pad. More particularly, the invention relates to a strip of such terminal clips carried at one of their ends by a carrier strip, and wherein the free ends of the clips are supported by an auxiliary support, whereby a strip of such clips is securely supported in position while being attached to a circuit-bearing chip.

2. Prior Art

Various clips are known in the art wherein a quantity of solder is associated with the clip so that when the clip has been positioned on a contact pad of a circuit-bearing chip and the assembly heated, the molten solder covers the adjacent surfaces of the clip and pad to form, when cool, a metallurgical joint between the clip and pad. For instance, terminals of this type with various arrangements of solder-holding and/or pad-contacting fingers are disclosed in Seidler U.S. Pat. No. 4,120,558 and U.S. Pat. No. 4,203,648, in each of which the body portion from which the fingers are formed is flat and wide enough so that each of the fingers will have adequate strength for its intended purpose.

Increasing commercial pressure for miniaturization of the circuit bearing chips and the clips or terminals associated therewith requires reduction of the size and spacing (pitch) of the contact pads and the clips. Since the pads are fully supported by the material of the chip, no difficulty is encountered with the reduced spacing of the pads. However, the terminals or clips which are attached to the pads must have at least enough inherent strength to be self-supporting as they are applied, and to maintain good electrical contact with their respective pads while being soldered. Reduction in the size of the clips in order to accommodate the reduced spacing of the contact pads makes the clips relatively flimsy. It is not economical to increase the gauge of the strip from which the terminals or clips are stamped, since a very thin strip is electrically satisfactory. As the clips become smaller and more fragile, there is an advantage to having them carried at both ends during the manufacturing process. However, this is not always possible when the clips are severely formed.

In order to overcome these problems, some manufacturers make the clips in discrete, short lengths and then form them. This procedure obviously increases the handling problems substantially, and makes such a process economically impractical.

Further, in some applications, the clips have stem ends which are adapted to extend through holes in circuit boards. Miniaturization of the circuits results in the holes being spaced very closely together, with resulant thin walls and weakness between adjacent holes.

SUMMARY OF THE INVENTION

Accordingly, it is a principal object of this invention to provide a strip of interconnected clips for attachment to contact pads on a circuit-bearing chip, wherein auxiliary support is connected with the clips to support the free ends thereof.

Another object of the invention is to provide a strip of interconnected terminal clips for attachment to contact pads on a circuit-bearing chip, wherein the clips are supported at both ends prior to forming and one end connection is then cut off, after which the part is formed to its final shape. When the final shape of the clip has been attained, the clips are crimped to an auxiliary support fed into the die, to support the relatively flimsy clips.

A further object of the invention is to provide a strip of interconnected clips for attachment to contact pads on a circuit-bearing chip, wherein the clips have a free end and a stem end, the stem end being connected to a carrier strip and an auxiliary support strand being connected with the free ends to provide auxiliary support to the clips.

Another object of the invention is to provide a plurality of terminal clips for connection between two circuit-bearing boards, wherein some of the clips have an angularly disposed interconnecting portion between the ends thereof to offset one end of the clip from the other end in both a rearward and sideward direction, so that the plurality of clips have one of their ends aligned, but the other ends of the plurality of clips are offset from one another to provide greater spacing between said other ends.

These and other objects and advantages of the invention are achieved by providing a strip of interconnected clips each having one end connected to a carrier strip and a pair of string fingers on the other end thereof for receiving the edge of a circuit-bearing chip therebetween, and wherein one of the fingers is engaged in at least partially encircling relationship with a support strand of non-conductive material to support the clips as they are applied to the chip and soldered. If the support strand or filament is non-conductive and has a melting point higher than the melting point of the solder, the strand can be left on the device after the soldering operation. If it is desirable to remove the strand after soldering, a score mark can be provided in the clip to break out the strand-supporting part. In this event, the strand can be either conductive or non-conductive.

In accordance with one particular aspect of the invention, a plurality of edge clips each have a free end and a stem end, and the stem ends of the clips are connected with a carrier strip. A pair of spaced apart spring fingers are on the free end of each clip for receiving an edge of the circuit-bearing chip therebetween, and an elongate auxiliary support strand extends past the free ends of the plurality of clips and is secured to the free end of each clip to provide auxiliary support for the clips.

In accordance with another aspect of the invention, an edge clip for attachment to a contact pad on a circuit-bearing board, comprises a free end and an elongate stem end with a plurality of spring fingers on the free end for receiving an edge of a circuit-bearing board therebetween. The elongate stem end is adapted to extend through a hole in a circuit-bearing board, and an angularly disposed interconnecting portion is connected between the free end and the stem end, offsetting the free end in both a sidward and rearward direction relative to the stem end.

BRIEF DESCRIPTION OF THE DRAWINGS

With reference to the drawings, several forms of the invention are illustrated in the several figures, wherein like reference characters designate like parts throughout the several views, and wherein:

FIG. 1 is a fragmentary plan view of a portion of a strip of interconnected clips having the auxiliary support in accordance with the invention;

FIG. 2 is a sectional view in elevation taken along line 2—2 in FIG. 1;

FIG. 3 is a fragmentary perspective view of a first modification of the clip shown in FIGS. 1 and 2, wherein a breakaway notch is formed in one of the spring fingers of the clip;

FIG. 4 is a view similar to FIG. 1 of a second modification of the invention;

FIG. 5 is a sectional view in elevation taken along 5—5 in FIG. 4;

FIG. 6 is a view similar to FIG. 5 of a third modification of the invention; and FIG. 7 is a fragmentary perspective view showing the manner in which a plurality of clips in accordance with FIGS. 1 and 4, respectively, are aligned when they are inserted into associated holes along the edge of a circuit-bearing board.

DETAILED DESCRIPTION OF THE PREFERRED EMBODIMENTS

A strip of interconnected clips is indicated generally at 10 in FIG. 1 and comprises a carrier strip 11 having spaced pilot holes 12 therein for indexing the strip through successive stamping operations in a power press, not shown, to form the clips. A plurality of uniformly spaced clips 13 are carried by the strip 11 and comprise elongate bodies or stem ends 14 integrally joined with one edge of the carrier strip 11. The free end of the clips 13 is formed with a pair of spaced apart spring fingers 15 and 16, between which the edge of a circuit-bearing chip (not shown) is to be received.

One of the fingers 16 partially encircles and securely grips a mass of solder 17, while the other finger 15 partially encircles and grips an auxiliary support comprising a continuous strand or filament 18, preferably of non-conductive material such as plastic or the like. Thus, as seen best in FIG. 1, the clips 13 are rigidly supported in uniformly spaced positions by means of the continuous strand 18 crimped to the free ends of the clips.

The clips according to the invention are formed from blanks folded about longitudinal fold lines to define a narrow clip having relatively wide fingers and stem portions.

As seen in FIG. 3, the spring finger 15 may have a fracture line 19 formed therein by a suitable notch or the like, whereby the spring finger and associated strand 18 may be separated from the clip after the clip is permanently attached as by soldering to a circuit-bearing chip. In this instance, the support strand 18 may be formed of a conductive material such as metal, if desired.

A second modification of the invention is illustrated in FIGS. 4 and 5, wherein a plurality of clips 13' are carried by the carrier strip 11. The clips 13' have elongate stem ends 14' with stops or shoulders 20 formed near the upper ends thereof and are intended to extend through openings in a circuit-carrying board. Above the stops 20, the body of the clips 13' is bent at an intermediate interconnecting portion 21 in both a rearward and sideward direction so that the upper portion or free end 22 of each clip is offset both rearwardly and sidewardly relative to the stem ends 14'. The spring fingers 15 and 16 with the associated mass of solder 17 and continuous support strand 18, respectively, are formed on the upper body portion 22.

Accordingly, as shown in FIG. 7, a circuit board 23 may have a plurality of holes 24 and 25 drilled therethrough in spaced, parallel rows adjacent an edge of the board, with the holes being spaced apart a distance of, for example, 0.100 of an inch. Then, if a plurality of clips 13 such as illustrated in FIG. 1 are inserted in the holes 25 in the back row, and a plurality of clips 13' such as illustrated in FIG. 4 are inserted in the holes 24 of the front row, the edge-engaging spring fingers 15 and 16 of the respective clips are in alignment with one another and the pitch or spacing between adjacent clips (0.050 of an inch in the example given) is only half as great as the spacing between adjacent holes.

A further example of the invention is illustrated in FIG. 6, wherein the clip 13" is severely formed between the carrier strip 11 and the spring fingers 15' and 16'. While this clip can be supported initially on carrier strips at both ends, it would be necessary to separate the clip body from one of the carrier strips before carrying out the severe forming step to the body. The clip would then be flimsy and difficult to manage when applying to a circuit carrying chip. In accordance with the invention, the continuous support 18 can be crimped to the free ends of the clips to hold the clips rigid and in position for subsequent attachment to a circuit bearing chip.

Therefore, in accordance with the present invention, it is possible to arrange the clips with pitches as small as 0.050 of an inch rather than 0.100 of an inch as commonly used heretofore. The reduction in pitch is effected with no significant reduction in the material used in the clip and with ample spacing between the holes in which the stem ends of the clips are associated. Moreover, the clips may be severely formed between their ends and subsequently crimped to a continuous auxiliary support strand to rigidify the clips.

It will thus be seen that the objects set forth above, among those made apparent from the preceding description, are efficiently attained and, since certain changes may be made in the above article without departing from the spirit and scope of the claims appended thereto, it is intended that all matter contained in the description and shown in the accompanying drawings shall be interpreted as illustrative and not in a limiting sense.

What is claimed is:

1. A strip of interconnected edge clips for attachment to contact pads on a circuit-bearing chip, comprising:
   a plurality of edge clips each having a free end and a stem end, the stem ends of the clips being connected with a carrier strip;
   a pair of spaced apart spring fingers on the free end of each clip for receiving an edge of the circuit-bearing chip therebetween; and
   an elongate non-conductive auxiliary support strand extending past the free ends of the plurality of clips and being secured to the free end of each clip to provide auxiliary support for the clips, one of the spring fingers of each clip being crimped to the auxiliary support strand and a mass of solder being held by the other spring finger of each clip.

2. A strip of interconnected edge clips for attachment to contact pads on a circuit-bearing chip, comprising: a plurality of edge clips each having a free end and a stem end, the stem ends of the clips being connected with a carrier strip;

a pair of spaced spring fingers on the free end of each clip for receiving an edge of the circuit-bearing chip therebetween; and an elongate auxiliary support strand extending past the free ends of the plurality of clips and being secured to the free end of each clip to provide auxiliary support for the clips; one of the spring fingers of each clip being crimped to the auxiliary support strand, and said one spring finger having a notch therein defining a fracture line, whereby the finger may be broken to release the support strand after the clip is attached to a circuit-bearing board.

* * * * *